United States Patent [19]

Fertig et al.

[11] Patent Number: 4,923,824
[45] Date of Patent: May 8, 1990

[54] SIMPLIFIED METHOD OF FABRICATING LIGHTLY DOPED DRAIN INSULATED GATE FIELD EFFECT TRANSISTORS

[75] Inventors: Daniel J. Fertig, Edina; Matthew F. Schmidt, Bloomington, both of Minn.

[73] Assignee: VTC Incorporated, Bloomington, Minn.

[21] Appl. No.: 186,555

[22] Filed: Apr. 27, 1988

[51] Int. Cl.⁵ .................. H01L 21/265; H01L 21/203
[52] U.S. Cl. ........................................ 437/44; 437/41;
437/105; 437/186; 437/26; 357/23.4; 357/23.3
[58] Field of Search ............... 437/26, 41, 44, 186, 437/105; 357/23.3, 23.4, 23.9, 23.11, 23.14

[56] References Cited

U.S. PATENT DOCUMENTS

| | | | |
|---|---|---|---|
| 3,959,025 | 5/1976 | Polinsky | 437/41 |
| 4,038,107 | 7/1977 | Marr et al. | 437/44 |
| 4,087,902 | 5/1978 | Feltner | 437/44 |
| 4,242,691 | 12/1980 | Kotani et al. | 357/23.3 |
| 4,251,828 | 2/1981 | Sakurai | 357/23.7 |
| 4,315,781 | 2/1982 | Henderson | 437/41 |
| 4,419,809 | 12/1983 | Riseman et al. | 437/41 |
| 4,513,303 | 4/1985 | Abbas et al. | 357/23.3 |
| 4,546,534 | 10/1985 | Nicholas | 437/29 |
| 4,597,824 | 7/1986 | Shinada et al. | 156/643 |
| 4,599,118 | 7/1986 | Han et al. | 437/41 |
| 4,649,629 | 3/1987 | Miller et al. | 437/48 |
| 4,656,492 | 4/1987 | Sunami et al. | 357/23.3 |
| 4,660,062 | 4/1987 | Nishizawa et al. | 357/23.3 |
| 4,680,603 | 7/1987 | Wei et al. | 357/23.3 |
| 4,691,433 | 9/1987 | Pimbley et al. | 437/44 |
| 4,703,551 | 11/1987 | Szluk et al. | 437/30 |
| 4,789,644 | 12/1988 | Meda | 437/41 |
| 4,795,718 | 1/1989 | Beitman | 437/41 |

FOREIGN PATENT DOCUMENTS

| | | | |
|---|---|---|---|
| 0274278 | 7/1988 | European Pat. Off. | 357/23.3 |
| 0141372 | 6/1988 | Japan . | |
| 0289870 | 11/1988 | Japan | 357/23.3 |

OTHER PUBLICATIONS

Magdo et al., "Fabricating Complimentary MOS Transistors", IBM Technical Disclosure Bulletin, vol. 15, No. 6, 11/1972, pp. 1767-1768.

Primary Examiner—Brian E. Hearn
Assistant Examiner—M. Wilczewski
Attorney, Agent, or Firm—Kinney & Lange

[57] ABSTRACT

A lightly doped drain in an IGFET is provided by fabricating the transistor in a epitaxial layer lightly doped in the conductivity type of the channel for the device. The laterally reduced dopant concentration of the drain, and a lightly doped source if desired, is provided by leaving portions of the epitaxial layer unmodified.

5 Claims, 5 Drawing Sheets

SIMPLIFIED METHOD OF FABRICATING LIGHTLY DOPED DRAIN INSULATED GATE FIELD EFFECT TRANSISTORS

BACKGROUND OF THE INVENTION

1. Field of the Invention

The present invention relates to insulated gate field effect transistor devices and more particularly to a method of fabricating such devices with lateral stepped reductions in drain and source dopant concentration.

2. Description of the Prior Art

Insulated gate field effect transistors ("IGFETs") take their name from the structure of the device in the vicinity of the transistor gate. The gate electrode, herein typically doped polysilicon, is separated from doped semiconductor material by a silicon dioxide insulating layer. Imposition of an electric potential on the gate electrode results in the development of an electric field which attracts charge carriers toward the electrode. The charge carriers are prevented from reaching the electrode by the insulating layer, but provide a conductive path between the transistor source and drain in the semiconductor material adjacent the insulating layer.

The development of field effect transistors in integrated circuits has resulted in and points to still further miniaturization. However, in maintaining compatability with existing systems, the scale of power supply voltages used in conjunction with such devices has not been decreased. Accordingly, electric field strength levels have increased with each decrease in size of the devices as a result of geometric shaping and reduced distances. The effects of strong electric fields within IGFET devices include reduction of carrier mobility, and, particularly in N channel devices, impact ionization and hot electron injection into the silicon dioxide insulating layer adjacent the field effect transistor gate. Energized electrons which surmount the silicon/silicon dioxide energy barrier become trapped within the gate insulating layer and can affect the threshold voltage of the device as well as producing other undesirable effects, such as reduced conductivity.

One solution to this problem has been the lightly doped drain-source (LDD) N channel insulated gate field effect transistor.

The lightly doped drain-source structure introduces narrow, lightly doped N type regions between the channel and the more heavily doped N type source and drain regions. The effect of the interposed, more lightly doped N type conductivity regions is to spread out the electric field, particularly at the drain pinch-off region, to reduce maximum field magnitude.

An example of such a device is disclosed in U.S. Pat. No. 4,599,118 by Han et al. The Han et al. patent describes implanting at least a first reduced concentration region between the highly concentrated drains and sources and the gate region of the opposite conductivity type.

However, processes such as that disclosed in Han et al. are complex and involve steps not useful for the fabrication of other devices in an integrated circuit.

SUMMARY OF THE INVENTION

In accordance with the preferred embodiment of the present invention, an N type epitaxial layer is grown on a substrate over a P type region, either the substrate itself or a buried layer. An IGFET is then fabricated in the epitaxial layer. The epitaxial layer provides reduced dopant concentration areas which diffuse electric fields developed in field effect transistors. More particularly, a P type well is formed in the epitaxial layer in electrical contact with the P type buried layer or substrate, thus providing the channel region of the IGFET. The P type well also defines and isolates at least a first lightly doped N type region within the epitaxial layer. An insulated gate structure is formed over the PN junction formed between the well and the isolated section. Thereafter, two high dopant concentration self-aligned N type regions are formed in the epitaxial layer, the first into the lightly doped P type well and the second into the lightly doped N type isolated section of the epitaxial region. The two high dopant concentration regions will be arrayed along opposite sides of the insulated gate. The second high concentration N type region may be defined as the drain, which is separated from the lightly doped P- type well by the isolated N type section.

DETAILED DESCRIPTION OF THE PREFERRED EMBODIMENT

Figure 1A:
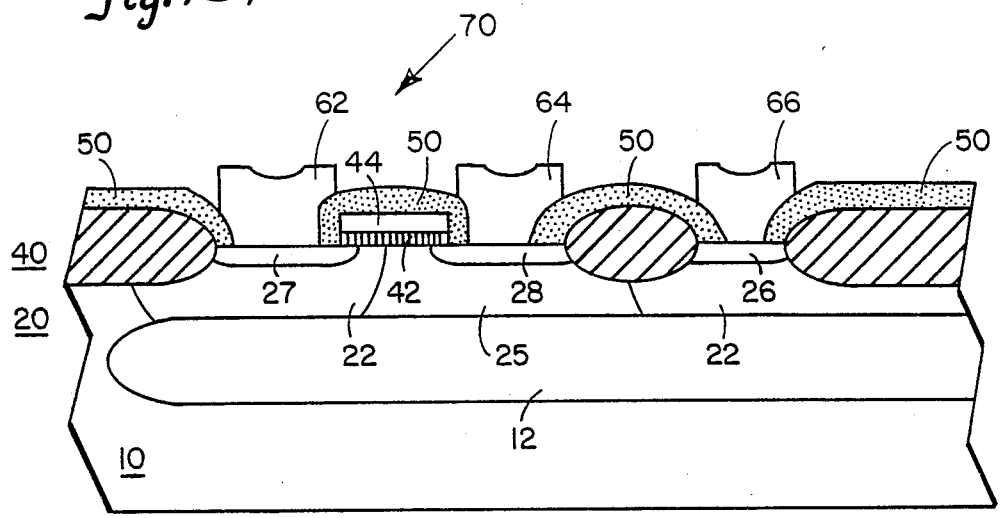
FIGS. 1A and 1B are cross sectional views of two embodiments of transistor device structures realizable with the method of the present invention.
Figure 1B:
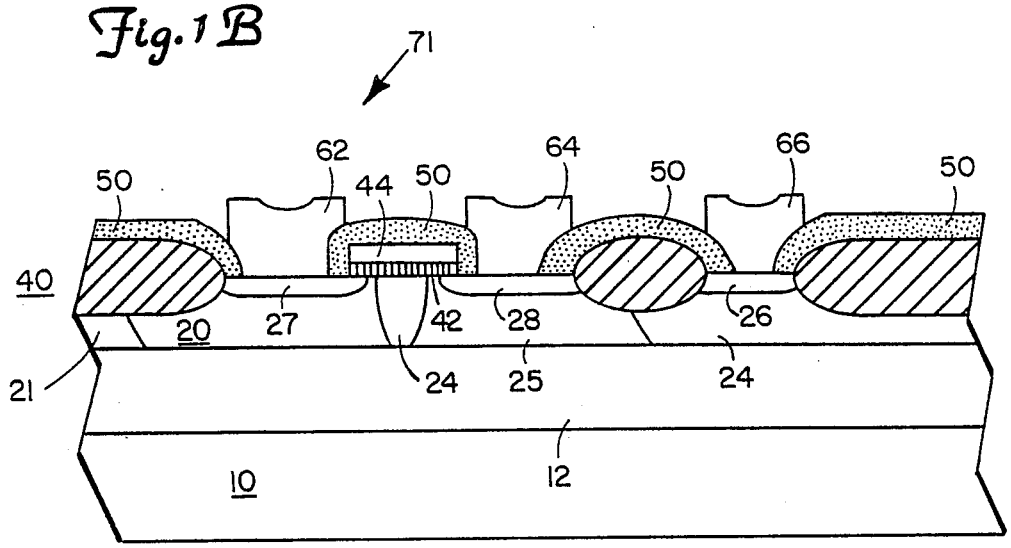

FIGS. 1A and 1B illustrate two N channel IGFETs fabricated in accordance with the method of the present invention. FIG. 1A illustrates a first type of LDD IGFET, generally referred to by numeral 70, wherein a lightly doped drain is provided.

IGFET 70 is disposed in a semiconductor body including a lightly doped P conductivity type substrate 10. The active transistor area may be underlied by a moderately doped P type buried layer 12.

A lightly doped N type epitaxial layer 20 lies on a surface of substrate 10. A lightly doped P type well 22 is provided in epitaxial layer 20. P type well 22 is disposed in part under gate electrode 44 to support an inversion channel for transistor operation.

Extending from the surface of epitaxial layer 20 partway through P type well 22 is source region 27. Source region 27 is a heavily doped N type conductivity region, isolated from other conductivity regions in the semiconductor body by P type well 22. Source region 27 supports a low resistance ohmic contact with electrode 62.

Lightly doped drain region 25 is an unmodified portion of the N type epitaxial layer 20, masked during formation of P type well 22. Lightly doped drain region 25 isolates heavily doped drain region 28 from other regions in the semiconductor body. Drain region 28 extends from the surface of epitaxial layer 20 partway through drain region 25 and supports a low resistance ohmic contact with a metallic drain electrode 64.

Disposed on the surface of epitaxial layer 20, extending from an edge of source region 27 to an edge of drain region 28 across intervening surface portions of P type well 22 and lightly doped drain 25, are gate insulator layer 42 and gate electrode 44. Gate insulator layer 42 comprises a thin silicon dioxide strip disposed directly on the surface of epitaxial layer 20 separating the doped polysilicon gate electrode 44 from epitaxial layer 20.

P type well 22 is electrically connected to buried layer 12. A heavily doped P type region 26 is disposed in a portion of a P type well 22 removed from the gate region of IGFET 70. P type region 26 is connected by metallic lead 66 to a reference voltage and thus prevents the development of floating voltage levels in IGFET 70.

An isolation layer 40 of silicon dioxide is shown on the surface of portions of epitaxial layer 20. A further device insulation layer 50 is disposed over isolation layer 40 and over gate electrode 44.

FIG. 1B illustrates another LDD IGFET 71. The structure of IGFET 71 is similar to IGFET 70 and like numerals refer to substantially identical structures in the two figures. Only the differences between the devices will be discussed here.

IGFET 71 provides for both a lightly doped drain and a lightly doped source. This is effected by substituting lightly doped P type well 24 for P type well 22 in IGFET 70. P type well 24 is located under gate electrode 44 and supports development of an inversion channel connecting N type well 25 and N type region 20. Unlike well 22, well 24 does not extend under source electrode 62 and is separated from source region 27 by a portion of unmodified epitaxial layer 20. Source region 27 is formed from the surface partway into unmodified epitaxial layer 20. Thus epitaxial layer 20 in the area around source region 27 provides a lightly doped source. Region 21 is formed during formation of P- type well 24 and serves electrical isolation functions.

Operation of either device is conventional. Electric fields appearing through the lightly doped drain and lightly doped source will be of reduced magnitude as a result of a small doping gradient and reduced impurity concentration.

FIGS. 2A-2J illustrate fabrication of IGFETS in accordance with the present invention. Depiction of application of photoresist layers and use of masks in the exposure of the same, has not been shown to simplify the depiction.

Figure 2A:
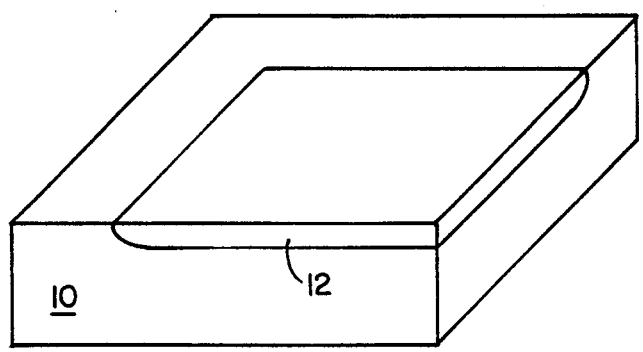
FIGS. 2A–2J are perspective views illustrating fabrication of an insulated gate field effect transistor.

FIG. 2A illustrates the first step in fabricating a field effect transistor according to the present invention. A lightly doped P type substrate 10 is provided, and a somewhat more heavily doped P type buried layer 12 may be formed partway into substrate 10 from its surface. It should be understood that a plurality of buried layers 12 are provided, but primarily for other devices in the integrated circuit. Buried layer 12 is not required by the IGFETS provided by the present invention.

Figure 2B:
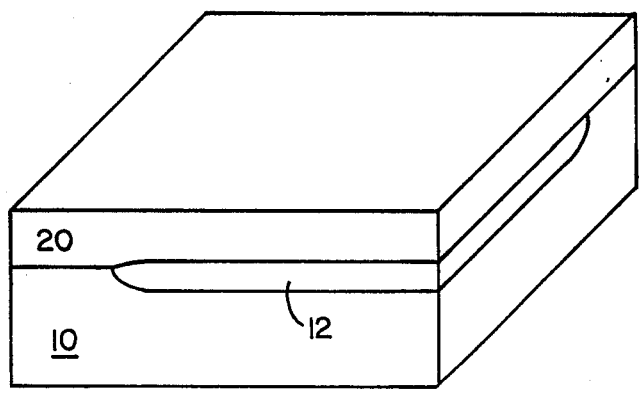

FIG. 2B illustrates the growth of a lightly doped N type epitaxial layer 20 over the surface of substrate 10 and the partial di±fusion of the P buried layer 12 into epitaxial layer 20.

Figure 2C:
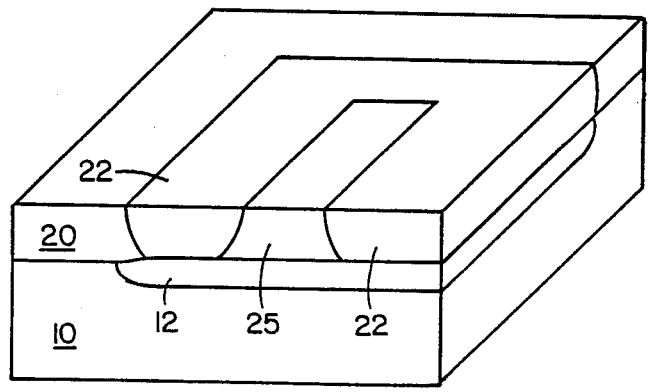

FIG. 2C illustrates formation of lightly doped P- well 22 in epitaxial layer 20. P- well 22 extends from the surface of epitaxial layer 20 through to electrical contact with buried layer 12 or substrate 10 if buried layer 12 is not present. A portion of P- well 22 is masked to isolate an unmodified portion 25 of epitaxial layer 20 from the rest of epitaxial layer 20 with P-well 22. The isolated portion of epitaxial layer 20 provides a lightly doped drain region 25 in IGFET 70.

Figure 2D:
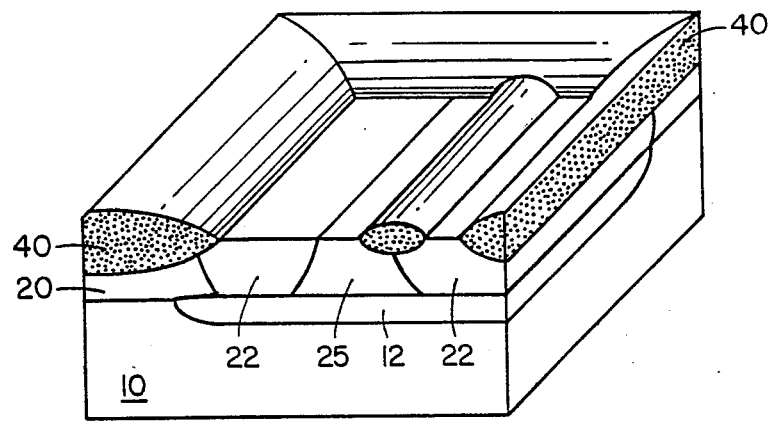

FIG. 2D illustrates growth of a silicon dioxide isolating layer 40 from epitaxial layer 20. Portions of the surface of P type well 22 and N type isolated region 25 are masked from growth of the isolating layer 40 to allow later growth of a gate insulating layer and attachment of electrodes.

Figure 2E:
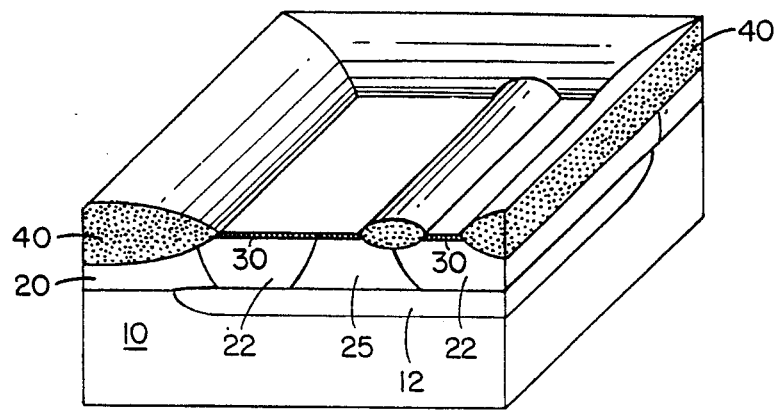

FIG. 2E illustrates growth of a gate oxide layer 30 over the surface portions of epitaxial layer 20 masked from growth of insulating layer 40. Gate oxide layer 30 is substantially thinner than isolating layer 40.

Figure 2F:
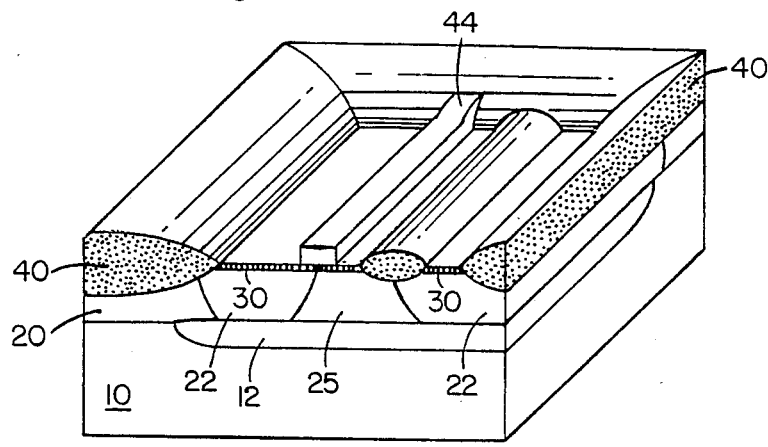

FIG. 2F illustrates deposition and definition of a gate electrode 44 over portions of gate oxide layer 30.

Figure 2G:
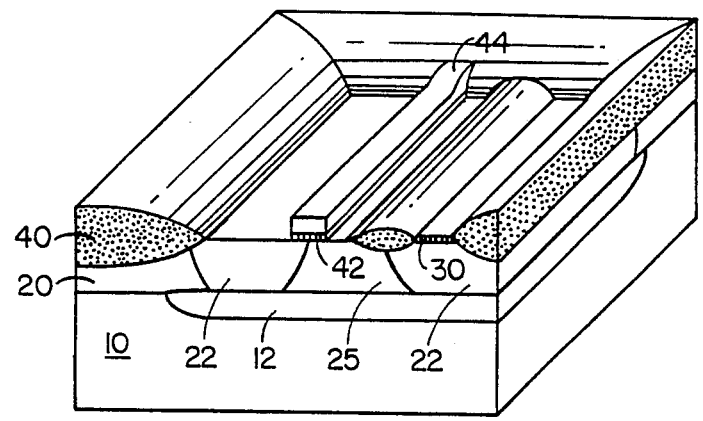
Figure 2H:
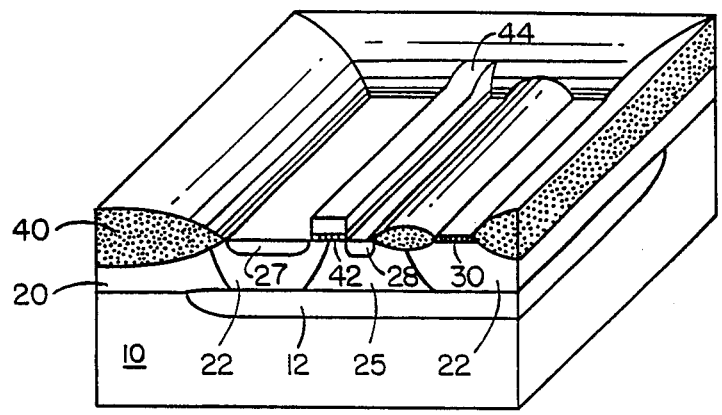

FIG. 2G illustrates opening a portion of gate oxide layer 30 to allow formation of heavily doped source region 27 and drain region 28 (shown in FIG. 2H). Polysilicon gate electrode 44 protects portions of gate oxide layer 30, which underlie gate electrode 44, the protected portion becoming gate insulating layer 42.

FIG. 2H depicts formation of a heavily doped N type source region partway into P- type well 22 and formation of a heavily doped N type drain region 28 into lightly doped drain region 25. P- type well 22 under gate electrode 44 will support development of an inversion channel between source region 27 and lightly doped drain region 25.

Figure 2I:
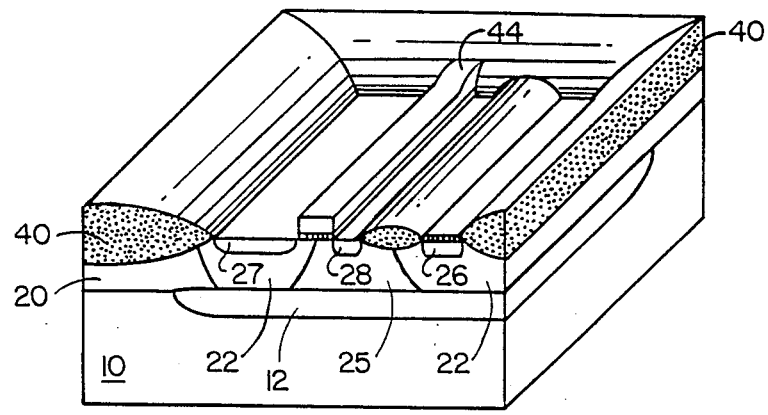

FIG. 2I illustrates implantation of a heavily doped P type region 26 through gate oxide layer 30 into a portion of P type well 22.

Figure 2J:
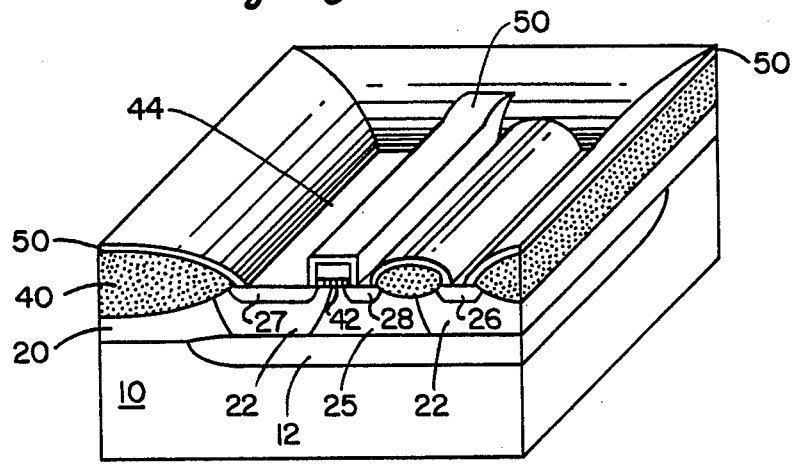

FIG. 2J illustrates deposition of device insulating layer 50 over isolation layer 40 and gate electrode 44. Portions of the surface of source region 27 and drain region 28 are masked and etched following the deposition of the insulating layer to allow attachment of metal leads to form electrodes. P type region 26 is also opened for attachment of a metallic lead by removal of gate oxide layer 30 and device insulating layer 50 from a portion of the surface of region 26.

FIGS. 1A and 1B illustrate the field effect transistors fabricated in accordance with the process of the present invention. Attachment of metallic leads 62, 64 and 66 to regions 27, 28 and 26, respectively, is illustrated.

The method of the present invention provides for simplified lightly doped drain and lightly doped source structures in insulated gate field effect transistors. Fabrication of such lightly doped structures demands no special implant or diffusion steps incompatible with formation of P channel and bipolar type devices in the same semiconductor body.

Although the present invention has been described with reference to a preferred embodiment, workers skilled in the art will recognize that changes may be made in form and detail without departing from the spirit and scope of the invention.

What is claimed is:

1. A method of fabricating an insulated gate field effect transistor comprising the steps of:
 (a) providing a semiconductor substrate including a first conductivity type region;
 (b) growing a lightly doped epitaxial layer of a second conductivity type on the surface of the substrate;
 (c) forming in the epitaxial layer at least a first well of the first conductivity type in electrical contact with the first conductivity type region of the substrate such that at least first and second portions of the second conductivity type of the epitaxial layer are electrically isolated from one another;
 (d) forming an insulated gate electrode on the surface of the epitaxial layer across at least a first diode junction between the first well and the first portion of the epitaxial layer;
 (e) forming at least first and second heavily doped second conductivity type regions in the epitaxial layer adjacent the gate electrode and separated from one another by the diode junction between the first well and the first portion of the epitaxial layer; and (f) attaching electrical contacts to the first and second heavily doped second conductivity type regions.

2. The method as defined in claim 1 wherein the first conductivity type is P type and the second conductivity type is N type.

3. The method as defined in claim 2 wherein the step of forming an insulated gate electrode includes forming the insulated gate electrode across the diode junction formed between the first well and the first portion of the epitaxial layer and a diode junction between the first well and the second portion of the epitaxial layer.

4. The method as defined in claim 2 wherein the first heavily doped type region is implanted into the first well and the second heavily doped N type region is implanted in the first portion of the epitaxial layer for forming a lightly doped drain.

5. A method of fabricating an N channel insulated gate field effect transistor comprising the steps of:

(a) providing a semiconductor substrate including a P type region;

(b) growing a lightly doped N type epitaxial layer over the substrate;

(c) forming at least a first P type well in the epitaxial layer in electrical contact with the P type region of the substrate, electrically isolating at least first and second portions of the N type epitaxial layer from one another;

(d) growing a gate oxide layer on the surface of the epitaxial layer over at least the diode junction between the first N type portion of the epitaxial layer and the P well disposed between the first and second N type portions;

(e) forming a gate electrode on the gate oxide;

(f) forming a first heavily doped N type region in the first N type portion adjacent the gate oxide layer, such that the first heavily doped N type region is separated from the P type well by the first portion of the epitaxial layer;

(g) forming a second heavily doped N type region in the P type well adjacent the gate oxide layer; and (h) attaching contacts to the first and second heavily doped regions.

* * * * *